(12) United States Patent
Mruthyunjaya

(10) Patent No.: US 9,971,039 B2
(45) Date of Patent: May 15, 2018

(54) APPARATUS AND METHOD OF DRD PANEL OPERATION USING OXIDE TFTS

(71) Applicant: Carestream Health, Inc., Rochester, NY (US)

(72) Inventor: Ravi K. Mruthyunjaya, Penfield, NY (US)

(73) Assignee: Carestream Health, Inc., Rochester, NY (US)

( * ) Notice: Subject to any disclaimer, the term of this patent is extended or adjusted under 35 U.S.C. 154(b) by 0 days. days.

(21) Appl. No.: 15/080,645

(22) Filed: Mar. 25, 2016

(65) Prior Publication Data

US 2016/0282477 A1 Sep. 29, 2016

Related U.S. Application Data

(60) Provisional application No. 62/138,603, filed on Mar. 26, 2015.

(51) Int. Cl.
| | |
|---|---|
| *G01T 1/26* | (2006.01) |
| *G01T 1/175* | (2006.01) |
| *G01T 1/24* | (2006.01) |
| *H01L 27/146* | (2006.01) |
| *H04N 5/32* | (2006.01) |

(52) U.S. Cl.
CPC ............... *G01T 1/175* (2013.01); *G01T 1/24* (2013.01); *H01L 27/14632* (2013.01); *H01L 27/14643* (2013.01); *H01L 27/14659* (2013.01); *H04N 5/32* (2013.01); *H01L 27/14663* (2013.01)

(58) Field of Classification Search
CPC .................... H01L 27/14609; H01L 27/14676
See application file for complete search history.

(56) References Cited

U.S. PATENT DOCUMENTS

2011/0001747 A1* 1/2011 Shimizu ............... G09G 3/3233
345/213

OTHER PUBLICATIONS

Liu et al., "Recovery from ultraviolet-induced threshold voltage shift in indium gallium zinc oxide thin film transistors by positive gate bias," 2013, Applied Physics Letters, vol. 103, pp. 20211-1 to 202110-4.*

* cited by examiner

*Primary Examiner* — Kiho Kim

(57) ABSTRACT

A method of operating a digital radiographic detector having an array of imaging pixels, wherein a predetermined gate voltage is applied to the transistor gates in the array in a dark environment. The preselected gate voltage is maintained for a predetermined duration to increase a threshold voltage of the transistor.

20 Claims, 5 Drawing Sheets

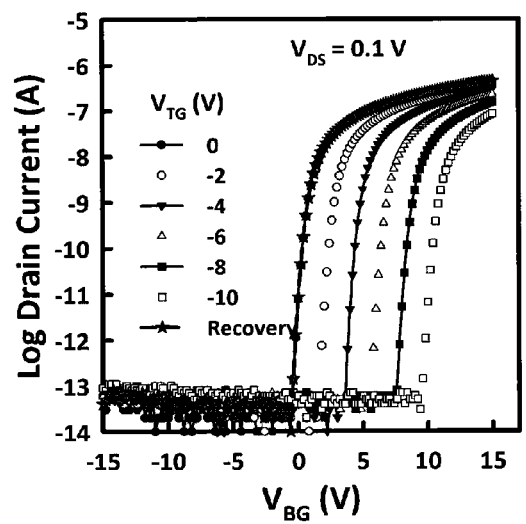
FIG. 6A
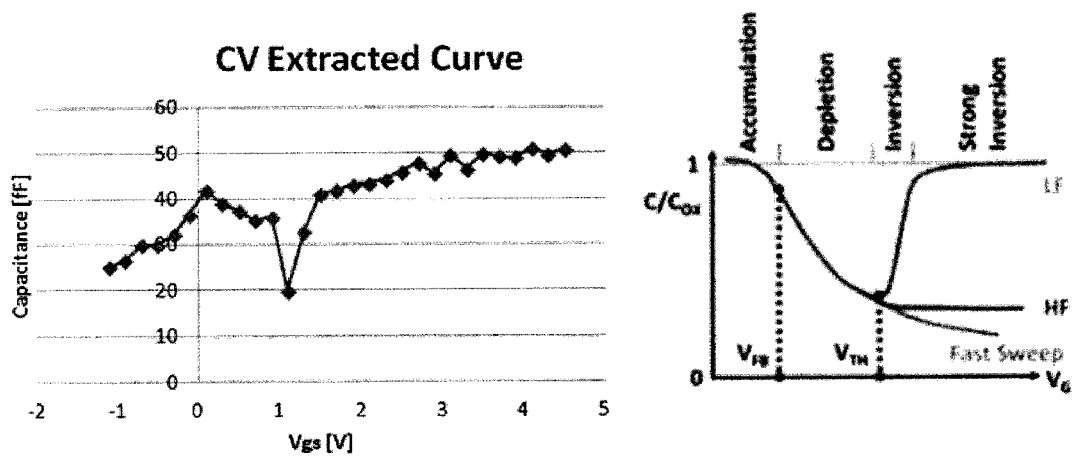
FIG. 7A  FIG. 7B

APPARATUS AND METHOD OF DRD PANEL OPERATION USING OXIDE TFTS

CROSS REFERENCE TO RELATED APPLICATIONS

This application claims priority to U.S. Patent Application Ser. No. 62/138,603, filed Mar. 26, 2015, in the name of Mruthyunjaya, and entitled APPARATUS AND METHOD OF DRD PANEL OPERATION USING OXIDE TFTS.

This application is related in certain respects to U.S. patent application Ser. No. 14/972,561, filed Dec. 17, 2015, in the name of Mruthyunjaya, and entitled COMPENSATION CIRCUIT FOR AN X-RAY DETECTOR; and U.S. patent application Ser. No. 14/972,628, filed Dec. 17, 2015, in the name of Tredwell, and entitled VT CALIBRATION AND COMPENSATION CIRCUIT FOR A DIGITAL RADIOGRAPHIC DETECTOR, both of which are incorporated herein by reference in their entirety.

BACKGROUND OF THE INVENTION

The subject matter disclosed herein relates to digital radiographic detectors (DRD), in particular, to a DRD and method of maintaining consistent operation thereof.

Stationary radiographic imaging equipment are employed in medical facilities (e.g., in a radiological department) to capture medical x-ray images on x-ray detectors. Mobile carts may also include an x-ray source used to capture x-ray images on a digital x-ray detector. Such medical x-ray images can be captured using various techniques such as computed radiography (CR) and digital radiography (DR) in radiographic detectors.

A related art DR imaging panel acquires image data from a scintillating medium using an array of individual sensors (pixels), arranged in a row-by-column matrix, in which each sensor provides a single pixel of image data. Each pixel generally includes a photosensor and a switching element that can be arranged in a co-planar or a vertically integrated manner, as is generally known in the art. In these imaging devices, hydrogenated amorphous silicon (a-Si:H) is commonly used to form the photodiode (photosensor) and the thin-film transistor (TFT) switch needed for each pixel. In one known imaging arrangement, a front plane has an array of photosensitive elements, and a backplane has an array of thin-film transistor (TFT) switches.

FIG. 1 is an exemplary diagram that shows a perspective view of an area detector behind a patient including rows and columns of detector cells in position to receive x-rays passing through the patient during a radiographic imaging procedure. As shown in FIG. 1, an x-ray system 10 in combination with a detector array 12 may include an x-ray tube 14 that is collimated to provide a directed x-ray beam 16 passing through an area 18 of a patient 20. The beam 16 is attenuated along its many rays by the internal structure of the patient 20 and is received by the detector array 12 that extends in two dimensions over a prescribed area (e.g., a plane) preferably perpendicular to a central ray of the x-ray beam 16.

The detector array 12 can be divided into a plurality of individual cells 22 that can be arranged rectilinearly in columns and rows. As will be understood to those of ordinary skill in the art, the orientation of the columns and rows is arbitrary, however, for clarity of description it will be assumed that the rows extend horizontally and the columns extend vertically.

In exemplary operations, the rows of cells 22 can be scanned one or more at a time by scanning circuit 28 so that exposure data from each cell 22 (i.e., an amount of electric charge) may be read by read-out circuit 30. Each cell 22 can independently measure an intensity of radiation received at its surface and thus the exposure data read-out from each cell 22 provides one pixel of information used to generate an image 24 as displayed on a monitor 26, normally viewed by the user. A bias circuit 32 can control a bias voltage applied to the cells 22.

Each of the bias circuit 32, the scanning circuit 28, and the read-out circuit 30, can communicate with an acquisition control and image processing circuit 34 that can coordinate operations of the circuits 28, 30 and 32, for example, by use of a processor included therein. The acquisition control and image processing circuit 34, can also control exemplary examination procedures, the x-ray tube 14 by turning it on and off, as well as controlling the tube current, and thus the fluence of x-rays in x-ray beam 16, and/or the tube voltage, and thus the energy of the x-rays in x-ray beam 16.

The acquisition control and image processing circuit 34 can provide image data to the monitor 26, based on the exposure data read out from each cell 22. Alternatively, acquisition control and image processing circuit 34 can manipulate the image data, store raw or processed image data (e.g., at a local or remotely located electronic memory) or export the image data.

Exemplary cells 22 may include a photo-activated image sensing element and a switching element for reading a signal from the image-sensing element. Image sensing can be performed by direct detection, in which case the image-sensing element directly absorbs the x-rays and converts them into charge carriers. However, in most commercial digital radiography panels indirect detection is used, in which an intermediate scintillator element converts received x-rays to visible-light photons that can then be sensed by a light-sensitive image-sensing element.

Examples of image sensing elements used in image sensing arrays 12 include various types of photoelectric conversion devices (e.g., photosensors) such as photodiodes (P-N or PIN type), photo-capacitors (MIS), photo-transistors or photoconductors. Examples of switching elements used for signal read-out include MOS transistors, bipolar transistors and p-n junction components.

DR detectors with amorphous or poly-crystalline photosensors, such as a-Si:H photosensors, require a power-up transition time from a zero-power state to a stable state ready for exposure. The time for the transition can be limited by the time required for the trap states in such photosensors to transition from a zero-bias state to a state capable of low-noise and stable operation. After some time in the zero-bias state, the traps in such photosensors can reach an equilibrium state corresponding to zero-bias. Upon power-up, such photosensors can transition to a reverse-bias state. Trap occupancy in the reverse bias state is considerably lower than in the zero bias state. In the transition from the zero bias state to the reverse bias state, the traps in such photosensors emit electrons and holes to the conduction band and valance band, respectively. The emission time constant for electrons and holes to be respectively emitted from trap states to the conduction and valance band depends on the energy difference between the trap energy and the respective band edge.

FIG. 2 is a schematic diagram 240 of a portion of a two-dimensional array 12 for the DR detector 40. The array of photosensor cells 212, whose operation may be consistent with the photosensor array 12 described above, may include a number of a-Si:H n-i-p photodiodes 270 and thin film transistors (TFTs) 271 formed as field effect transistors (FETs) each having gate (G), source (S), and drain (D) terminals. In embodiments of DR detector 40 disclosed herein, the two-dimensional array of photosensor cells 12 may be formed in a device layer that abuts adjacent layers of the DR detector structure. A plurality of gate driver circuits 228 may be electrically connected to a plurality of gate lines 283 which control a voltage applied to the gates of TFTs 271, a plurality of readout circuits 230 may be electrically connected to data lines 284, and a plurality of bias lines 285 may be electrically connected to a bias line bus or a variable bias reference voltage line 232 which controls a voltage applied to the photodiodes 270. Charge amplifiers 286 may be electrically connected to the data lines 284 to receive signals therefrom. Outputs from the charge amplifiers 286 may be electrically connected to a multiplexer 287, such as an analog multiplexer, then to an analog-to-digital converter (ADC) 288, or they may be directly connected to the ADC, to stream out the digital radiographic image data at desired rates. In one embodiment, the schematic diagram of FIG. 2 may represent a portion of a DR detector 40 such as an a-Si:H based indirect flat panel imager.

Incident x-rays, or x-ray photons, 16 are converted to optical photons, or light rays, by a scintillator, which light rays are subsequently converted to electron-hole pairs, or charges, upon impacting the a-Si:H n-i-p photodiodes 270. In one embodiment, an exemplary detector cell 222, which may be equivalently referred to herein as a pixel, may include a photodiode 270 having its anode electrically connected to a bias line 285 and its cathode electrically connected to the drain (D) of TFT 271. The bias reference voltage line 232 may control a bias voltage of the photodiodes 270 at each of the detector cells 222. The charge capacity of each of the photodiodes 270 is a function of its bias voltage and its capacitance. In general, a reverse bias voltage, e.g. a negative voltage, may be applied to the bias lines 285 to create an electric field (and hence a depletion region) across the p-n junction of each of the photodiodes 270 to enhance its collection efficiency for the charges generated by incident light rays. The image signal represented by the array of photosensor cells 212 may be integrated by the photodiodes while their associated TFTs 271 are held in a non-conducting (off) state, for example, by maintaining the gate lines 283 at a negative voltage via the gate driver circuits 228. The photosensor cell array 212 may be read out by sequentially switching rows of the TFTs 271 to a conducting (on) state by means of the gate driver circuits 228. When a row of the pixels 22 is switched to a conducting state, for example by applying a positive voltage to the corresponding gate line 283, collected charge from the photodiode in those pixels may be transferred along data lines 284 and integrated by the external charge amplifier circuits 286. The row may then be switched back to a non-conducting state, and the process is repeated for each row until the entire array of photosensor cells 212 has been read out. The integrated signal outputs are transferred from the external charge amplifiers 286 to an analog-to-digital converter (ADC) 288 using a parallel-to-serial converter, such as multiplexer 287, which together comprise read-out circuit 230.

This digital image information may be subsequently processed by image processing system 34 to yield a digital image which may then be digitally stored and immediately displayed on monitor 26, or it may be displayed at a later time by accessing the digital electronic memory containing the stored image. The flat panel DR detector 40 having an imaging array as described with reference to FIG. 2 is capable of both single-shot (e.g., static, radiographic) and continuous (e.g., fluoroscopic) image acquisition.

A TFT switch's threshold voltage (VT) is the voltage level which defines the transition between the "ON" and "OFF" states of the TFT switch. A gate voltage set to be less than the VT level represents the "OFF" configuration of the TFT. A gate voltage set to be greater than the VT level represents the "ON" configuration of the TFT, as illustrated in FIG. 3.

The discussion above is merely provided for general background information and is not intended to be used as an aid in determining the scope of the claimed subject matter.

BRIEF DESCRIPTION OF THE INVENTION

A method and apparatus for recovery from a decreasing VT shift in single or dual gated TFTs in a two-dimensional array of imaging pixels caused by cumulative x-ray exposure is disclosed herein. A method of operating a digital radiographic detector having an array of imaging pixels, wherein a preselected gate voltage is applied to the transistor gates in the array in a dark environment. The gate voltage is maintained for a predetermined duration to increase a threshold voltage of the transistor.

In one embodiment, a method of operating a digital radiographic detector having an array of imaging pixels is disclosed. Each pixel in the array has a photosensor and a gated switch. A predetermined voltage is applied to a gate of each gated switch in the array in a dark environment. The gate voltage is maintained for a predetermined duration to increase a threshold voltage of the gated switch, after which the applied voltage is turned off.

In another embodiment, a method of operating a digital radiographic detector having an array of imaging pixels is disclosed. Each pixel in the array has a gate. A voltage is applied to a gate of a pixel in the array in a dark environment. The applied voltage is turned off to inject an amount of charge into the pixel. A first datum is stored to represent the amount of charge injected into the pixel.

The summary descriptions above are not meant to describe individual separate embodiments whose elements are not interchangeable. In fact, many of the elements described as related to a particular embodiment can be used together with, and possibly interchanged with, elements of other described embodiments. Many changes and modifications may be made within the scope of the present invention without departing from the spirit thereof, and the invention includes all such modifications. The drawings below are intended to be drawn neither to any precise scale with respect to relative size, angular relationship, relative position, or timing relationship, nor to any combinational relationship with respect to interchangeability, substitution, or representation of a required implementation.

This brief description of the invention is intended only to provide a brief overview of subject matter disclosed herein according to one or more illustrative embodiments, and does not serve as a guide to interpreting the claims or to define or limit the scope of the invention, which is defined only by the appended claims. This brief description is provided to introduce an illustrative selection of concepts in a simplified form that are further described below in the detailed description. This brief description is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

So that the manner in which the features of the invention can be understood, a detailed description of the invention may be had by reference to certain embodiments, some of which are illustrated in the accompanying drawings. It is to be noted, however, that the drawings illustrate only certain embodiments of this invention and are therefore not to be considered limiting of its scope, for the scope of the invention encompasses other equally effective embodiments. The drawings are not necessarily to scale, emphasis generally being placed upon illustrating the features of certain embodiments of the invention. In the drawings, like numerals are used to indicate like parts throughout the various views. Thus, for further understanding of the invention, reference can be made to the following detailed description, read in connection with the drawings in which:

FIG. 6A is a graph of the log of drain current vs bottom gate voltage showing characteristic curves of an exemplary dual-gate TFT with increasing negative top gate bias driven by a separate supply;

FIGS. 7A-7B are graphs of capacitance vs gate-source voltage showing an exemplary capacitance extraction curve and a theoretical MOS capacitance curve, respectively.

DETAILED DESCRIPTION OF THE INVENTION

Figure 1:
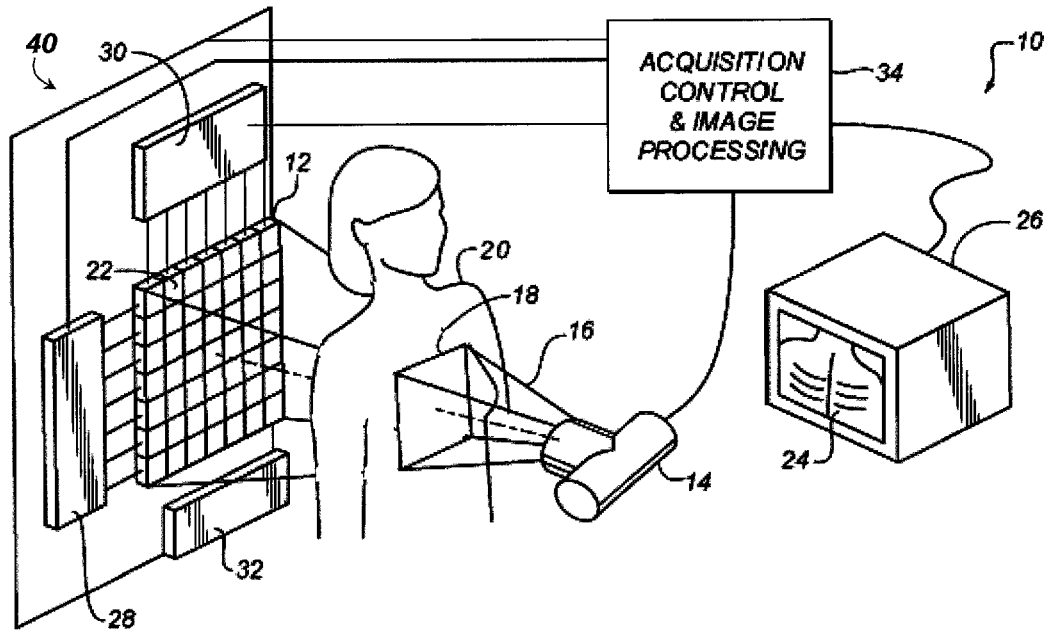
FIG. 1 is a diagram that shows a perspective view of an exemplary radiographic imaging apparatus including an exemplary DR detector composed of rows and columns of photosensor cells in position to receive x-rays passing through a patient during a radiographic procedure.
Figure 2:
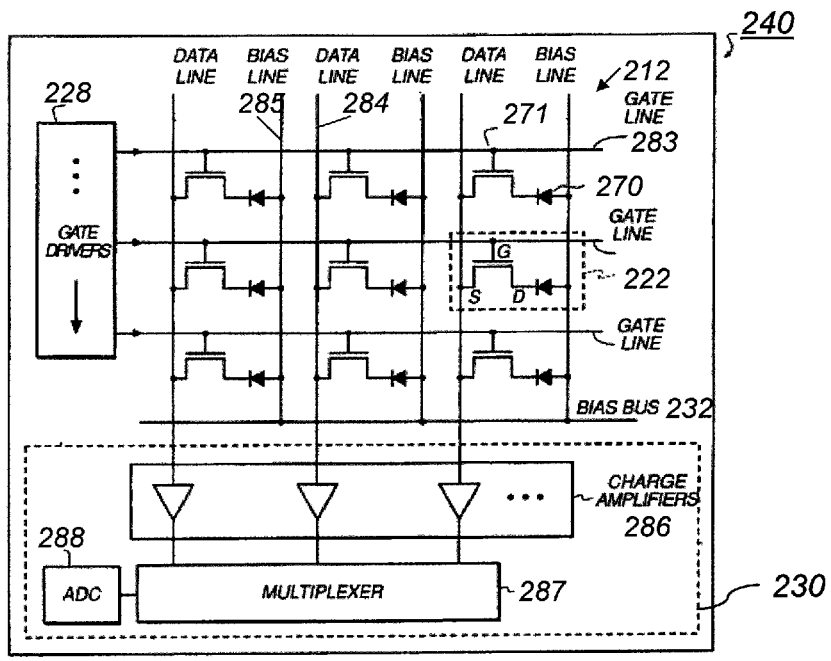
FIG. 2 is a schematic diagram of an array of photosensor cells as may be used in the apparatus of FIG. 1.
Figure 3:
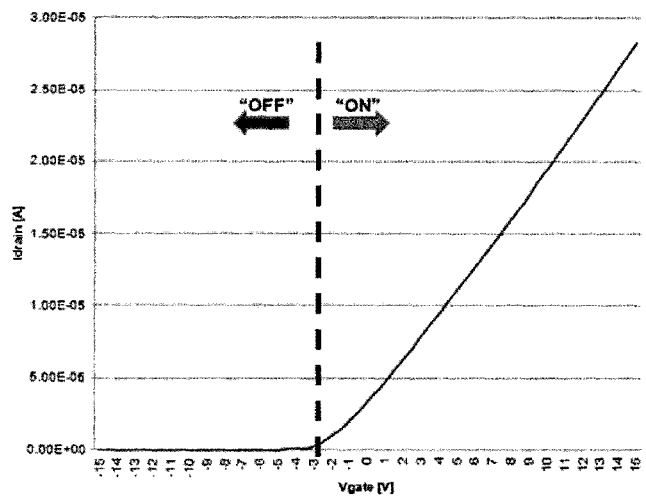
FIG. 3 is a plot of drain current vs gate voltage showing exemplary TFT "ON" and "OFF" regions.
Figure 4:
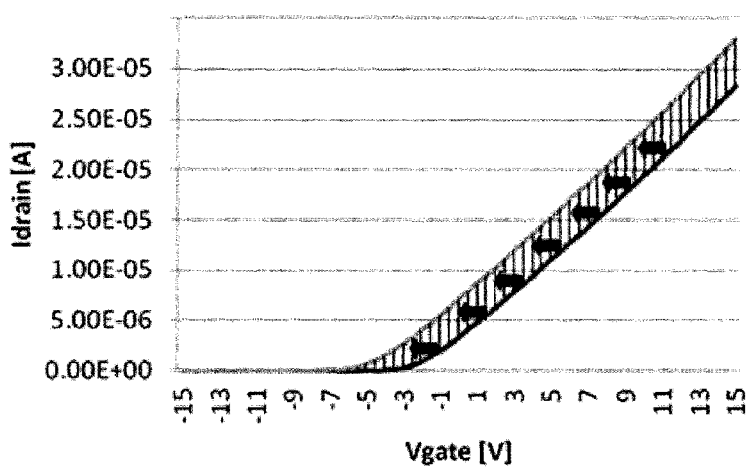
FIG. 4 is a graph of drain current vs gate voltage showing exemplary VT drift to the left (decreasing)

The TFT VT may not be identical for each of the TFT elements in a DRD array. One source of non-uniformity may include process variations inherent in the DRD fabrication process. The curve shown in FIG. 3 may be thought of as a mean VT representing a family of curves when considering an array of TFT elements. Another source of non-uniformity is VT shift due to DRD operating temperatures. If the DRD is operated at elevated temperatures, then the VT will effectively shift to the left (decrease), as shown in FIG. 4, compared to a VT level at room temperature. When the DRD is operated at reduced temperatures then the VT will shift to the right (increase) compared to a VT level at room temperature. The "ON" and "OFF" TFT operating points which may be assumed to be fixed for the life of the DRD should be chosen to account for any and all sources of VT variation due to process and operating temperature.

Although the TFT element in a DRD array is typically made up of an amorphous silicon semiconducting material, in one embodiment, an indium-gallium-zinc-oxide (IGZO) based compound may be used as an alternative semiconductor material which has key benefits over amorphous silicon. IGZO has both better "ON" and "OFF" characteristics compared to amorphous silicon. The VT level in IGZO TFT's is sensitive to UV and x-ray exposure. An IGZO TFT will have a VT shift to the left (FIG. 4) with increasing UV and x-ray exposure. This VT shift is assumed not to recover in an idle DRD at room temperature. The UV sensitivity can be practically eliminated with a light blocking layer over the IGZO TFT channel region. However x-ray exposures have a much shorter wavelength compared to UV exposure and a simple light shield provides little protection.

The physical mechanism with respect to the IGZO sensitivity to x-ray exposure is the creation of oxygen vacancies in the IGZO semiconducting material and the increase of interface traps with increasing cumulative x-ray exposure. Both mechanisms result in an increase in fixed positive charge (holes) in the TFT channel region. The increase in fixed positive charge effectively shifts the VT to the left (FIG. 4). Over the life of the DRD the VT may continue to shift left past the "OFF" gate voltage condition, which increases the pixel leakage current and reduces the charge that can be captured by each pixel's photodiode element. The effective Quantum Efficiency will drop over the life of the DRD. The rate of VT shift is a function of the IGZO material properties, including thickness of the IGZO material, for example.

Figure 5:
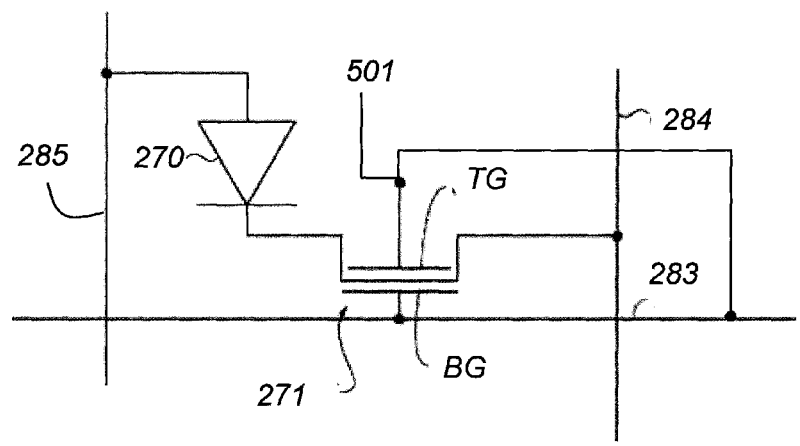
FIG. 5 is a schematic diagram of a dual gate TFT structure.

With respect to FIG. 5, a common TFT structure uses only a bottom gate BG electrode. A voltage is applied to the bottom gate BG using a gate line 283 at a voltage less than or greater than the VT in order to configure the TFT 271 to be "OFF" or "ON", respectively. An alternative TFT structure utilizes a top gate TG electrode in addition to the bottom gate BG electrode. One use of the top gate electrode TG is to allow driving both top gate TG and bottom gate BG electrodes with the same applied voltage on gate line 283. This configuration is known as a dual driving TFT with the benefit of higher "ON" currents compared to a single driving gate TFT given the same input voltage.

Another use of the top gate electrode is to adjust the effective VT by electrically driving a separate voltage level 501 on the top gate TG. In this configuration the reference TFT performance can be realized by normally operating the bottom gate electrode BG with the top gate electrically tied to 0V. If the top gate electrode is electrically biased less than 0V the effective VT will shift to the right (increase). FIG. 6A illustrates a family of curves showing that TFT VT shifts to the right with increasing negative bias voltage ($V_{TG}$) applied to the top gate TG. Note that shifting the effective VT of the TFT to the right is in the direction of compensating for any left VT shift due to increased accumulated lifetime x-ray exposure. However, this compensation approach may be considered as limiting because controlling the top-gate globally does not account for the non-uniform VT shift due to non-uniform accumulated x-ray exposure by pixels in the array over the life of the DRD. Also note that the effective global VT shift to the right does not reduce variations due to process and temperature. So a family of VT curves around a mean may be advantageously considered for an array of TFT elements.

A method for VT shift recovery caused by accumulated x-ray exposure for a single or dual gated structure of oxide TFT's is disclosed herein. This method can be utilized at any time in a dark environment (unexposed, or while not being exposed to radiographic energy), thus requiring no x-ray source or other forms of illumination sources. This method can be used in either single or dual gate structure IGZO TFT's. This method can be performed under program control, which program may be stored in an electronic memory of the DRD and executed by an on-board processor. The program may be set to be activated after a predetermined duration of non-use (idle time), periodically, upon request by an operator, upon detecting a charging of a battery in the DRD, upon detecting a replacement of a battery in the DRD, or a combination thereof.

In the case of dual gate structure with independent top gate TG voltage control, the top gate TG TFT voltage can be set to a 0V reference voltage level during the recovery method. As described herein, the physical mechanism with respect to IGZO x-ray sensitivity is the creation of oxygen vacancies in the IGZO semiconducting material and the increase of interface traps with increasing cumulative x-ray exposure. Both mechanisms result in an increase in fixed positive charge. This increase in fixed positive charge shifts the effective VT to the left (FIG. 4).

The method of recovery described herein includes applying a current stress through the TFT. The term recovery or recovery method may be used synonymously herein with stress method, current stress, compensation, calibration, or recalibration. Under current stress, the TFT undergoes electron trapping in the gate dialectic which inhibits the gate voltage field, effectively shifting the VT to the right and thereby compensating for any VT shift to the left caused by cumulative x-ray exposure. Thus, the compensation method disclosed herein may involve the steps of powering down DRD circuits that are not necessary for performing the current stress, and applying a compensation voltage to the gates of the TFTs in the array using, for example, the on-board gate control (read-out) circuitry. The compensation voltage applied to perform the current stressing is selected to be higher that the TFT's "OFF" voltage level and lower than the TFT's "ON" voltage level (FIG. 8), which compensation voltage may range from about 1 V to about 25 V, for example. The compensation voltage may be applied for a preselected amount of time depending on an amount of VT shift to the left, which may vary depending on a particular DRD. In one embodiment, one (1) minute of current stress may be applied for every one (1) Rad (equivalent to 0.01 gray) of cumulative x-ray exposure. In another embodiment, a DRD's rate of VT drift may be determined experimentally and a time duration, as well as a voltage level, of the compensation voltage may be selected accordingly.

In a typical DRD exposure operation, a common photo-diode bias voltage level may be −3V, a common "ON" TFT voltage level may be 20V and a common data line voltage level may be 1.5V. In one embodiment of the method of recovery described herein using current stress, circuitry for setting the diode voltage bias level may be turned on and set at 2.0V for current stressing; an "ON" TFT voltage level (compensation voltage) may be 3V; and circuitry for driving the data lines may be turned on and set at a common data line voltage of 1.5V. In the case of a dual gate structure in a dual driving configuration, both the bottom and the top gate TFT voltage may be set at the "ON" TFT voltage of 3V.

The VT compensating shift to the right will not be constant during the stressing period. Since the effective VT is shifting to the right, closer to the applied current stress "ON" gate voltage level, the amount of current will be decreasing over the stress time due to the decreasing difference between effective VT and the applied compensation voltage. The amount of current will eventually be driven to zero and the effective VT will clamp approximately equal or slightly less than the applied current stress "ON" gate voltage level. This may be essential because the final effective VT point can be adjusted by the current stress "ON" TFT voltage level to customize the required margin from the normally operating "OFF" gate voltage. This method will also reduce the VT non-uniformity over the pixel array, which can be present due to the inherent process variations as described herein.

Cumulative x-ray exposure levels are not expected to be uniform across the entire DRD, therefore the VT left shift and the shift recovery (right shift) is not expected to be the same over the entire pixel array. Thus, the current stressing method disclosed herein is a non-linear function based on how much a particular TFT has shifted left due to increasing accumulated x-ray exposure. A TFT that has received no x-ray exposure will not be stressed by an applied stress current even if the current stressing procedure is performed repeatedly. Therefore, the method disclosed herein will not overstress the TFT.

Placing a DRD array in current stressing mode for VT recovery may be performed at any time in a non-exposure period of time. Experimental data may be used to assess the rate of VT shift with increasing accumulated x-ray exposure and the rate of VT compensation using current stress. The required stress time may be easily calculated, or selected based on the experimental data, and applied during normal usage. As an example, the current stressing may be performed during battery charging or battery replacement which will be required in normal practice.

Two approaches may be utilized to compensate for the left VT shift caused by increasing accumulated x-ray exposure of TFT's. One approach, mentioned herein, is to drive a separate voltage level increasingly negative on a top gate of a dual-gate TFT. Another approach includes applying current stress using a selectable "ON" voltage level. Both approaches effectively shift the VT to the right and compensate the VT shift to the left.

A method to determine (extract) the VT of a TFT in order to detect and track VT changes over the life of the DRD is disclosed herein. However, it is not necessary to determine the VT of pixels in a pixel array before applying the recovery method described herein. The method to determine the VT may be used to find the current VT level for any or all pixels in the array at any point in the life of the DRD to determine the rate at which it changes over the life of the DRD. This information can be used to determine when or how often re-calibration may be scheduled and performed. As described herein, re-calibration may be scheduled and automatically performed under program control. An operator using such a programmed DRD need not be aware of the method being performed therein.

Figure 6B:
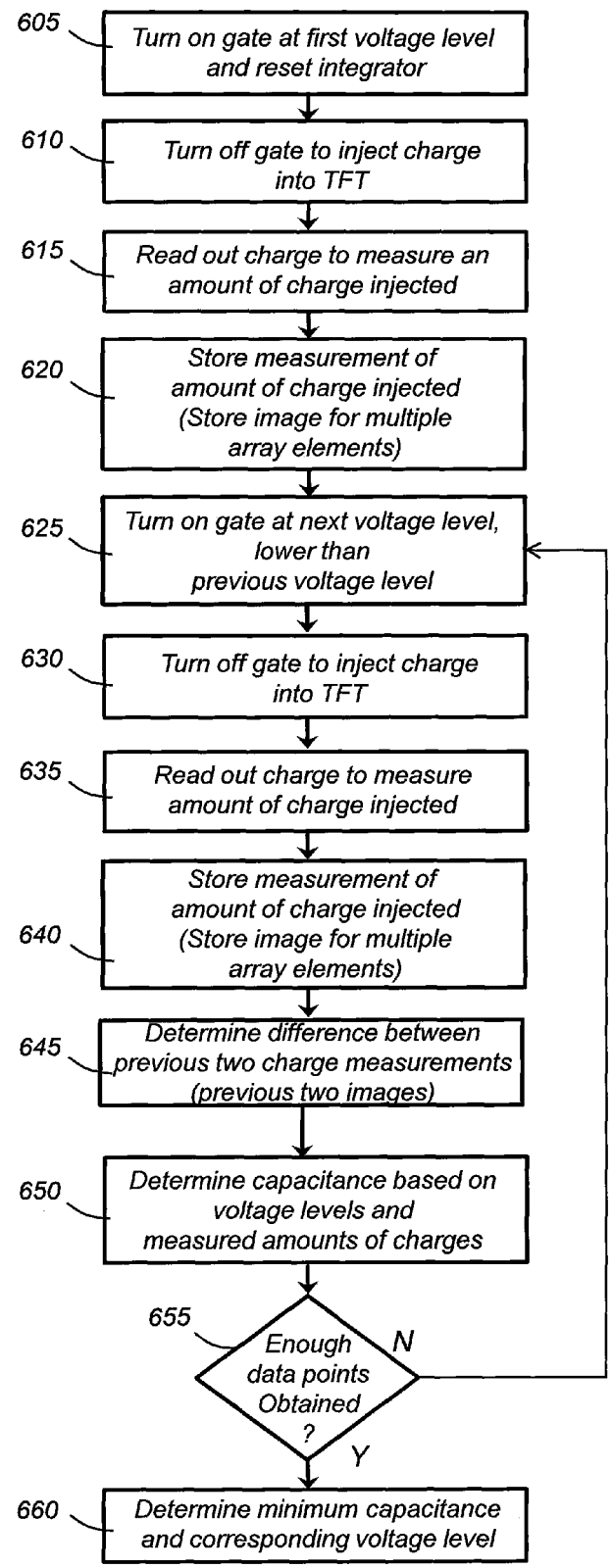
FIG. 6B is a flowchart of a method to determine VT.

Referring to FIG. 6B, in one embodiment, the VT may be determined using a DRD timing change and modified voltage settings. These may be controlled by a programmed procedure. First, in reference to each pixel in the array, the gate voltage level is set to an "ON" level above the current VT while the readout integrator circuit is reset, at step 605. The readout integrator is then placed into an integrate mode. As the falling edge of the TFT gate voltage from "ON" to "OFF" occurs, at step 610, the change in voltage will inject an amount of charge onto the input to the integrator circuit which is proportional to the voltage difference of the "ON" and "OFF" levels and the TFT capacitance. The TFT capacitance is a combination of the overlap and channel capacitance of the TFT when the gate level "ON" voltage is above the VT. An array "image" can be obtained (read out) which contains each of the array TFT's charge injection levels, at step 615. This image may then be stored for further processing, at step 620. This sequence is repeated using a second "ON" voltage level lower than the first "ON" voltage level by a known predetermined amount, i.e., a known voltage delta (ΔV) at steps 625-640. A second image can be obtained (read out) which contains each of the array TFT's charge injection levels at the second "ON" level. The difference between the first and second "ON" voltage level (ΔV) will result in a difference in injected charge (ΔQ) into each of the array TFTs, as measured between the first and second obtained images which were stored, i.e., the second image may be subtracted from the first image to determine ΔQ, at step 645. Thus, there is a correspondence between an amount of injected charge and the applied voltage level.

The capacitance may be calculated by using the simple Q=CV relationship, at step 650. The first ΔV and ΔQ data point thus obtained may be used to plot a CV extraction curve, as shown in FIG. 7A. The first data point is plotted at the right terminus of the CV extraction curve. The sequence described above is repeated over several iterations, e.g., using a third "ON" voltage level lower than the second "ON" voltage level by a known predetermined amount, and so on, at step 655, until an extracted CV curve is obtained by generating data points from right-to-left, as exemplified in FIG. 7A. The sequence may be terminated, at step 655, after a selected number of iterations, after an "ON" voltage level threshold has been reached, after a local minimum measured capacitance is determined, or a combination thereof. A minimum measured capacitance on the extracted CV curve is noted and its corresponding "ON" voltage level is determined, at step 660, which, in the exemplary CV curve of FIG. 7A, is about 1.1-1.2 V, as shown, which is equivalent to the corresponding VT. The DRD may be programmed to provide an indication that the VT, determined by the method described herein, is below a selected threshold. For example, the DRD may be configured to illuminate an LED.

The exemplary graph shown in FIG. 7A may represent measured capacitance in one or more TFTs, or a mean capacitance of several or all TFTs across an array of imaging pixels, thus providing measured VT of one or more TFTs, or a mean VT of all TFTs in an array. FIG. 7B illustrates a theoretical ideal CV curve which corresponds to the measured CV curve of FIG. 7A.

When the "ON" voltage level used to obtain both the first and second array images are above the actual VT, the total capacitance is expected to be approximately constant (FIGS. 7A-7B) since the TFT measurement includes both the overlap and channel capacitance of the TFT in both cases. As the "ON" voltage levels reach the actual VT level the net injected charge will reach a minimum, and therefore the total capacitance will also reach a minimum equal to only about one-half (½) the total overlap capacitance. The voltage measured at this minimum data point can be interpreted as the actual VT level of the TFT. The smaller that the fixed ΔV is selected for measurement the finer the resolution that can be obtained to extract a more precise actual VT. As described herein, this method can be performed "in the dark" using no x-ray exposure. Therefore, measuring and tracking the VT using this method can be performed at any time during the life of the DRD. As described herein, the extraction curve can be calculated for every pixel in the array, in a selected region in the pixel array, or one or more selected pixels in the array depending on the required system speed and efficiency in the analysis.

In a single gate pixel structure only one (bottom) gate controls the TFT switch. In normal DRD operation the "OFF" voltage level may be set to the left of the actual VT level and the "ON" voltage level may be set to the right of the actual VT level. The bottom gate "OFF" voltage level and post-fabrication VT level difference may be small and therefore a margin to account for any left VT shift due to accumulated x-ray exposure may be small. A large enough margin from the post-fabrication VT level should be taken into account when choosing the "OFF" voltage level.

In a dual gate structure, the TFT may be configured in two ways: (1) A dual driving configuration where the top and bottom gate are connected together (FIG. 5); and (2) A top gate electrode with independent voltage control (501 FIG. 5) in order to adjust the final effective VT level. If the baseline top gate voltage level for the second configuration is 0V then in order to achieve higher margin a top gate electrode can be set to a value less than the baseline voltage level, effectively shifting the VT more to the right of the "OFF" voltage level.

In IGZO TFTs the VT level will shift to the left of the post fabrication VT level, thereby decreasing the margin and ultimately moving beyond the "OFF" level if no other method of recovery is executed. The result will be a loss in quantum efficiency due to excessive TFT leakage. A method of panel operation for DRD applications may utilize both the method of VT extraction described herein and the method of VT shift recovery described herein to create a stable system solution with respect to IGZO x-ray sensitivity. In one embodiment, a method of panel operation for DRD applications may utilize only the method of VT shift recovery without VT extraction, by performing the recovery method at appropriate intervals. As described herein, the VT shift recovery method may be performed automatically under program control. This method of operation utilizes current stressing to recover from the left VT shift due to increasing accumulated x-ray exposure.

The method of CV extraction described herein can be used to first characterize the rate of VT change due to increasing accumulated x-ray exposure and current stress for a given fabrication process. As described herein, the CV curve extraction method may be performed automatically under program control. The rate of VT shift may not be the same from one process to another and will also depend on the material properties and TFT structure, including thickness of the fabrication layers. Understanding these rates for a given process will allow for a robust overall system solution. One measured rate obtained from experimental data indicates using one (1) minute of current stress for every one (1) Rad of accumulated x-ray exposure.

Figure 8:
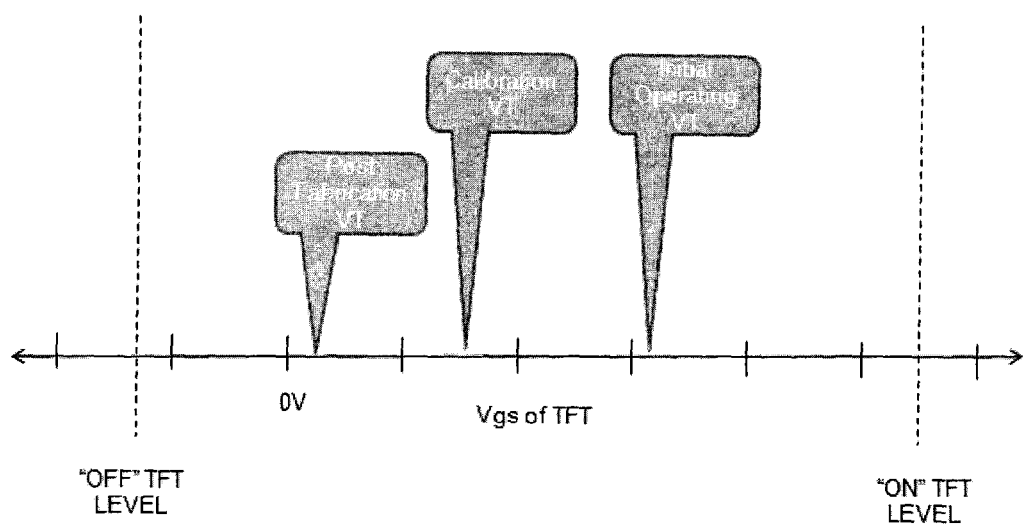
FIG. 8 shows critical threshold gate-source voltage points that may be set by current stressing.

As indicated in FIG. 8, the TFT "OFF" voltage level is typically left of (less than) the critical VT levels of post-fabrication VT, calibration (recovery) VT, and initial operating VT. The TFT "ON" level is typically right of (more than) these critical VT levels. As shown, after fabrication the VT level is expected to be at or just above 0V. A first (recovery) current stress can be performed by applying a gate stress voltage above the post fabrication VT level as described herein. This will shift the VT level to the right of the post fabrication level leaving more margin from the TFT "OFF" level. This new VT level can also be used as a stable DRD calibration point.

Although no additional current stressing is required, it may be necessary to shift the VT to the right of the calibration point for additional margin from the TFT "OFF" level, additional calibration margin, and overall robust system performance. This can be done using an additional current stress at a higher gate stress voltage level than the calibration gate stress voltage level. Note that this approach can be used for both a single gate TFT structure and a dual gate TFT structure configured as a dual driving TFT. However, this second VT level could also be achieved using a dual gate structure with an independent electrode. The independent electrode of a dual gate structure can be set to a voltage less than a baseline 0V to increase the final effective VT level, as described herein. This latter approach is limited compared to a second current stressing due to non-uniform cumulative x-ray exposure over the entire imaging array area and life time use.

Once the DRD reaches the initial operating VT level, two methods can be used to maintain appropriate VT levels and avoid a VT shift left of the "OFF" TFT level. The first method is to periodically check the VT level for each pixel, or in selected pixel regions, using the VT extraction method described herein to determine if the current stress method is required. The second method involves current stressing at any stage in the DRD use cycle. Since the rates of VT shift are known and deterministic, the time required for compensating left VT shift due to cumulative x-rays can be determined. The compensation can be performed during DRD battery charging or other appropriate DRD idle states. Note that the current stressing method does not overstress the TFT. The current stressing method is a non-linear function based on how much a specific TFT has undergone a left-shifted VT due to increasing cumulative x-ray exposure. A TFT that has had no exposure will not undergo current stress even if current stressing mode is performed. Therefore this method will not overstress the TFT.

As will be appreciated by one skilled in the art, aspects of the present disclosure may be embodied as a system, method, or computer program. Accordingly, aspects of the present invention may take the form of an entirely hardware embodiment, a software embodiment (including firmware, resident software, micro-code, etc.), or an embodiment combining software and hardware aspects that may all generally be referred to herein as a "service," "circuitry," "module," and/or "system." Furthermore, aspects of the present invention may take the form of a computer program embodied in a processor and memory used on board a DRD and having computer readable program code embodied thereon to perform the algorithms and methods described herein.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable random access memory (RAM) device, a read-only memory (ROM) device, an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, processor or device that may be used in or connected to a DRD.

Program code and/or executable instructions embodied on a computer readable medium may be transmitted using any appropriate medium, including but not limited to wireless, wireline, optical fiber cable, RF, etc., or any suitable combination of the foregoing. Computer program code for carrying out operations of measuring or extracting a CV curve or for performing and timing a current stress or other method of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's device, partly on the user's device, as a stand-alone code, partly on the user's device and partly on a remote computer or entirely on the remote computer or server. In the latter scenario, the remote computer may be connected to the user's device through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor, a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a processor, a computer, other programmable data processing apparatus, or other devices to function in a particular manner, such that the instructions stored in the computer readable medium produce an article of manufacture including instructions which implement the function/act specified in the flowchart and/or block diagram block or blocks.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A method of operating an array of imaging pixels in a digital radiographic detector, wherein each pixel in the array of imaging pixels comprises a photosensor and a gated switch, the method comprising:
   applying a predetermined gate voltage to each gate of a plurality of gated switches in the array in a dark environment, the applied predetermined gate voltage being greater than an OFF voltage level of the plurality of gated switches;
   maintaining the applied predetermined gate voltage for a predetermined duration to increase a threshold voltage of the plurality of gated switches; and
   turning off the applied predetermined gate voltage in the dark environment.

2. The method of claim 1, wherein the step of applying includes applying a gate voltage lower than an operating voltage level of the plurality of gated switches.

3. The method of claim 1, wherein the step of maintaining includes maintaining the predetermined gate voltage for a predetermined duration according to a function of one minute duration for each one Rad of mean cumulative x-ray exposure by the array.

4. The method of claim 1, wherein the step of applying comprises applying the predetermined gate voltage to said each gate of a plurality of thin-film-transistor switches.

5. The method of claim 4, further comprising connecting a data line to a source of each of the plurality of thin-film-transistor switches and applying a data line voltage less than the predetermined gate voltage to the data line for the predetermined duration.

6. The method of claim 5, further comprising applying a bias voltage less than the predetermined gate voltage to the photosensor in each of a plurality of imaging pixels corresponding to the plurality of gated switches in the array of imaging pixels for the predetermined duration.

7. The method of claim 1, further comprising applying a bias voltage less than the predetermined gate voltage to the photosensor in each of a plurality of imaging pixels corresponding to the plurality of gated switches in the array of imaging pixels for the predetermined duration.

8. The method of claim 7, further comprising applying a voltage less than the bias voltage to a data line connected to the plurality of gated switches for the predetermined duration.

9. The method of claim 1, further comprising initiating a stored program to perform the steps of applying, maintaining, and turning off.

10. The method of claim 1, further comprising:
applying another gate voltage higher than the predetermined gate voltage to said each gate of the plurality of gated switches in the array in the dark environment;
maintaining said another applied gate voltage for a second time duration to further increase the threshold voltage of the plurality of gated switches; and
turning off said another applied gate voltage in the dark environment.

11. A method of operating an array of imaging pixels for a digital radiographic detector to determine a capacitance property of selected ones of the imaging pixels, wherein each pixel in the array of imaging pixels comprises a gate for a switch, the method comprising:
applying a first voltage to the gate of a pixel in the array of imaging pixels in a dark environment;
turning off the applied first voltage to inject a first amount of charge into the pixel in the array of imaging pixels, the first amount of charge determined at least in part by the capacitance property of the pixel; and
storing a first datum representing the first amount of charge injected into the pixel in the array of imaging pixels.

12. The method of claim 11, further comprising:
applying a second voltage to the gate of the pixel in the array of imaging pixels in the dark environment;
turning off the applied second voltage to inject a second amount of charge into the pixel in the array of imaging pixels, the second amount of charge determined at least in part by the capacitance property of the pixel; and
storing a second datum representing the second amount of charge injected into the pixel in the array of imaging pixels.

13. The method of claim 12, further comprising determining a first capacitance of the pixel in the array of imaging pixels based on the first datum, the second datum, the first voltage and the second voltage.

14. The method of claim 13, further comprising:
applying a third voltage to the gate of the pixel in the array of imaging pixels in the dark environment;
turning off the applied third voltage to inject a third amount of charge into the pixel in the array of imaging pixels, the third amount of charge determined at least in part by the capacitance property of the pixel; and
storing a third datum representing the third amount of charge injected into the pixel in the array of imaging pixels.

15. The method of claim 14, further comprising determining a second capacitance of the pixel in the array of imaging pixels based on the second datum, the third datum, the second voltage and the third voltage.

16. The method of claim 15, further comprising determining a threshold voltage of the pixel in the array of imaging pixels based on the first capacitance and the second capacitance.

17. The method of claim 16, further comprising configuring the digital radiographic detector to provide an indication if the threshold voltage of the pixel in the array of imaging pixels falls below a predetermined threshold.

18. The method of claim 17, further comprising initiating a threshold voltage adjustment procedure in response to the indication.

19. The method of claim 18, further comprising initiating a stored program to perform the threshold voltage adjustment procedure.

20. The method of claim 15, further comprising determining that a threshold voltage of the pixel in the array of imaging pixels is equivalent to the third voltage.

* * * * *